(12) United States Patent  
DeBrito et al.

(10) Patent No.: US 12,471,229 B2
(45) Date of Patent: Nov. 11, 2025

(54) DEVICE WITH TOLERANCE ABSORBING REMOVABLE JOINT AND METHOD OF ASSEMBLING A DEVICE WITH A TOLERANCE ABSORBING REMOVABLE JOINT

(71) Applicant: Ford Global Technologies, LLC, Dearborn, MI (US)

(72) Inventors: Chris J. DeBrito, Canton, MI (US); Rami Batarseh, Sterling Heights, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 146 days.

(21) Appl. No.: 18/545,551

(22) Filed: Dec. 19, 2023

(65) Prior Publication Data
US 2025/0203789 A1    Jun. 19, 2025

(51) Int. Cl.
*H05K 5/02* (2006.01)
*F16B 35/04* (2006.01)
*F16B 37/04* (2006.01)

(52) U.S. Cl.
CPC ......... *H05K 5/0217* (2013.01); *F16B 35/045* (2013.01); *F16B 37/043* (2013.01); *F16B 2200/99* (2023.08)

(58) Field of Classification Search
CPC ... H05K 5/0217; F16B 35/045; F16B 37/043; F16B 5/0258; F16B 2200/99; B60K 2360/165; G02F 1/13308; G02F 1/133331; G02F 1/133332
See application file for complete search history.

(56) References Cited

U.S. PATENT DOCUMENTS

| | | | |
|---|---|---|---|
| 5,807,515 A | 9/1998 | Fisher et al. | |
| 5,950,277 A * | 9/1999 | Tallmadge | F16B 5/0258 174/153 G |
| 6,560,124 B1 * | 5/2003 | Irie | H05K 5/02 313/461 |
| 7,466,540 B2 | 12/2008 | Takahashi et al. | |
| 7,697,272 B2 | 4/2010 | Choi | |

(Continued)

FOREIGN PATENT DOCUMENTS

| | | |
|---|---|---|
| CN | 108393247 | 8/2018 |
| CN | 108540597 | 9/2018 |

(Continued)

*Primary Examiner* — William L Miller
(74) *Attorney, Agent, or Firm* — Burris Law, PLLC

(57) ABSTRACT

A device includes an inner body, back cover, front panel, and fastener assembly. The front panel is sealingly coupled to a front surface of the back cover. The front panel encloses the inner body within the back cover. The fastener assembly supports the inner body relative to the back cover and includes a first component, second component, retainer, and adhesive. The first component includes a stud and a first face. The stud extends through a rear wall of the back cover. The first face is disposed on a forward side of the rear wall. The second component is coupled to a rear side of the inner body and includes a second face opposing the first face. The retainer removably engages the stud on a rear side of the rear wall to couple the first component to the back cover. The adhesive adheres the first and second faces together.

20 Claims, 5 Drawing Sheets

(56) References Cited

U.S. PATENT DOCUMENTS

| | | | |
|---|---|---|---|
| 7,889,484 B2 | 2/2011 | Choi | |
| 8,305,512 B2* | 11/2012 | Ju | H04N 5/65 |
| | | | 349/58 |
| 10,203,533 B2 | 2/2019 | Kang | |
| 10,598,974 B2* | 3/2020 | Shimojo | B60K 35/10 |
| 2008/0298001 A1* | 12/2008 | Choi | G02F 1/133308 |
| | | | 361/679.02 |
| 2010/0266800 A1 | 10/2010 | Dutsch et al. | |
| 2011/0019351 A1 | 1/2011 | Bayne et al. | |
| 2011/0059275 A1 | 3/2011 | Stark et al. | |
| 2016/0187711 A1* | 6/2016 | Kida | G02F 1/133308 |
| | | | 349/12 |
| 2016/0368379 A1* | 12/2016 | Larry | B60K 35/22 |
| 2019/0212606 A1* | 7/2019 | Koda | G02F 1/133308 |
| 2021/0076115 A1* | 3/2021 | Choi | H04R 1/028 |
| 2022/0163695 A1 | 5/2022 | Zhou et al. | |
| 2023/0301001 A1* | 9/2023 | Yamagami | H05K 5/0217 |
| | | | 361/807 |
| 2024/0276657 A1* | 8/2024 | Beau | H05K 5/0213 |
| 2024/0336811 A1* | 10/2024 | Hsieh | C09J 1/00 |
| 2024/0381557 A1* | 11/2024 | Jang | H05K 5/03 |
| 2024/0422473 A1* | 12/2024 | Kim | H04R 1/2826 |
| 2025/0092897 A1* | 3/2025 | Beyer | F16B 5/0241 |

FOREIGN PATENT DOCUMENTS

| | | | | |
|---|---|---|---|---|
| CN | 108561391 | | 9/2018 | |
| CN | 112412275 | | 2/2021 | |
| CN | 113921582 | | 1/2022 | |
| CN | 217767726 U | * | 11/2022 | |
| EP | 4530482 A1 | * | 4/2025 | B60K 35/22 |
| WO | WO-2023207559 A1 | * | 11/2023 | G02B 30/56 |

* cited by examiner

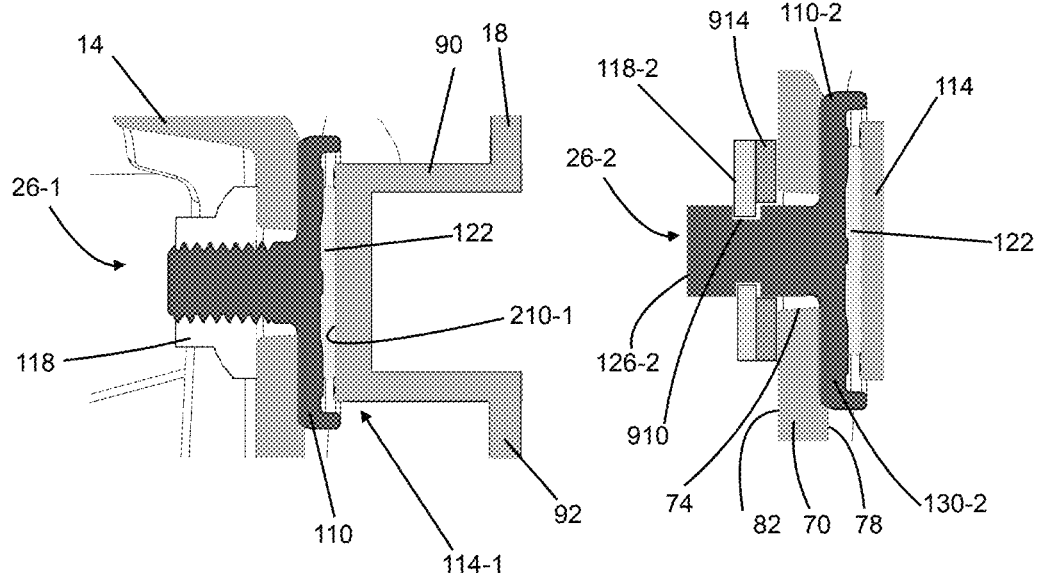
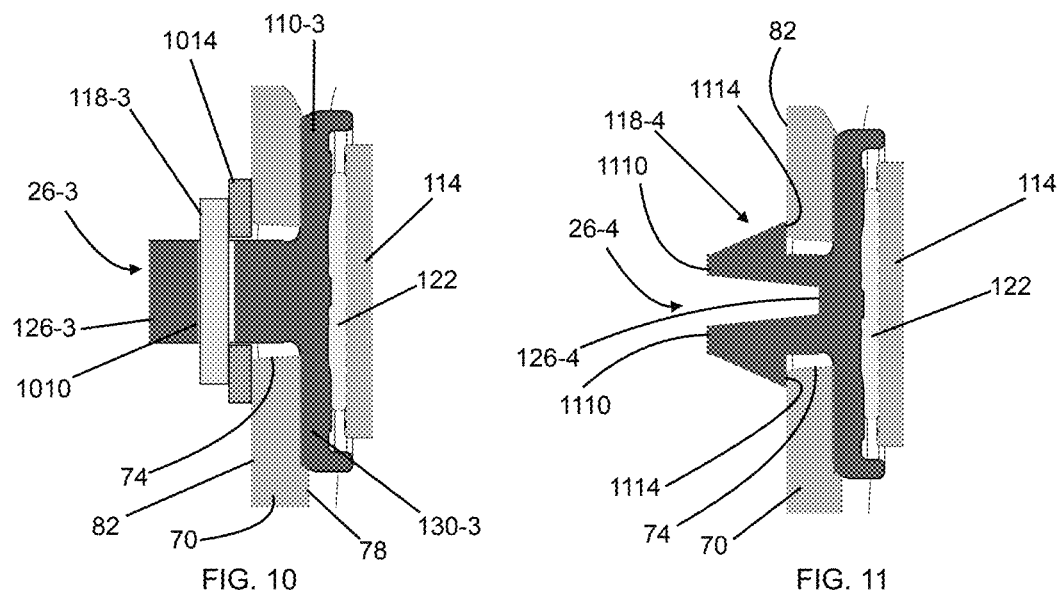

DEVICE WITH TOLERANCE ABSORBING REMOVABLE JOINT AND METHOD OF ASSEMBLING A DEVICE WITH A TOLERANCE ABSORBING REMOVABLE JOINT

FIELD

The present disclosure relates to a device with a tolerance absorbing removable joint and a method of assembling such a device.

BACKGROUND

The statements in this section merely provide background information related to the present disclosure and may not constitute prior art.

Some devices include a back cover, an inner body, a front panel, and a plurality of seals materials that seal the front panel to the back cover and the inner body to enclose the inner body and other components in a cavity defined by the back cover and the front panel. For example, a display in a vehicle (e.g., an infotainment system display or an instrument panel) can be such a device in which the front panel is a glass material that encloses electronics and a display screen mounted to an inner body within a cavity defined by a back cover and the front panel.

In such devices, the seals formed between the front panel and the back cover and the inner body are typically an adhesive glue or tape. However, manufacturing and part tolerances can cause the distance between the front panel and the back cover and the distance between the front panel and the inner body to vary. If the distances are too small, then the glue or tape can be over compressed. For glue, this can cause the glue to squeeze out and be visible or affect adhesion. For tape or traditional fasteners, the compression can distort the front panel, which, in the case of a display, can cause distortion effects visible to a user. If the distances are too large, then the insufficient bonding or sealing may occur.

The present disclosure addresses these and other issues with devices that include a back cover, an inner body, a front panel, and a plurality of seals that seal the front panel to the back cover and the inner body to enclose the inner body and other components in a cavity defined by the back cover and the front panel.

SUMMARY

This section provides a general summary of the disclosure and is not a comprehensive disclosure of its full scope or all of its features.

In one form the present disclosure provides for a device includes an inner body, a back cover, a front panel, and a fastener assembly. The front panel is sealingly coupled to a front surface of the back cover. The front panel encloses the inner body within the back cover. The fastener assembly supports the inner body relative to the back cover and includes a first component, a second component, a retainer, and an adhesive. The first component includes a stud and a first face. The stud extends through a rear wall of the back cover. The first face is disposed on a forward side of the rear wall. The second component is coupled to a rear side of the inner body and includes a second face opposing the first face. The retainer removably engages the stud on a rear side of the rear wall to couple the first component to the back cover. The adhesive adheres the first and second faces together.

According to variations of this device, which may be employed individually or in any combination: the front panel is sealingly coupled to a front surface of the inner body; the first and second faces are substantially planar; at least one of the first face and the second face includes a plurality of recessed regions and protrusions; the stud includes a thread and the retainer threadably engages the thread; the second component includes a threaded shaft that is threadably engaged with a mating thread of the inner body; the inner body includes a threaded shaft that is threadably engaged with a mating thread disposed on the second component; the device further includes an electronic display mounted to a forward side of the inner body, wherein at least a region of the front panel is transparent or translucent and positioned so that the electronic display can be viewed therethrough from an exterior of the device; the first component includes a lip, the first face being recessed rearward from the lip; the lip extends about a perimeter of the first face and a perimeter of the second face; the second component includes a lip that extends forward from a perimeter of the second face; the second component includes a lip, the second face being recessed forward from the lip; the lip extends about a perimeter of the first face and a perimeter of the second face.

In another form, the present disclosure provides for a device including an inner body, an electronic display, a back cover, a front panel, and a fastener assembly. The electronic display is mounted to a forward side of the inner body. The front panel is sealingly coupled to a front surface of the inner body and a front surface of the back cover. The front panel encloses the inner body within a cavity defined by the back cover and the front panel. At least a region of the front panel is transparent or translucent and positioned so that the electronic display can be viewed therethrough from an exterior of the device. The fastener assembly supports the inner body relative to the back cover and includes a first component, a second component, a retainer, and an adhesive. The first component includes a stud and a first face. The stud extends through a rear wall of the back cover. The first face is disposed on a forward side of the rear wall. The second component is coupled to a rear side of the inner body and includes a second face opposing the first face. The retainer removably engages the stud on a rear side of the rear wall to couple the first component to the back cover. The adhesive adheres the first and second faces together.

According to variations of this device, which may be employed individually or in any combination: the stud includes a thread and the retainer threadably engages the thread; the first component includes the lip and the first face is recessed rearward from the lip, the lip extending at least partially about a perimeter of the first face; at least one of the first face and the second face includes a plurality of recessed regions and protrusions; one of the inner body and the second component includes a threaded shaft and the other one of the inner body and the second component includes a mating thread threadably engaged with the threaded shaft.

In yet a further form, the present disclosure provides for a method of assembling a device, the device including an inner body, a back cover, a front panel, and a fastener assembly. The method includes positioning a first component of the fastener assembly so that a stud of the first component extends through a back wall of the back cover and a first face of the first component is disposed on a forward side of the back wall of the back cover; removably attaching a retainer to a portion of the stud that is disposed on a rearward side of the back wall to couple the first component to the back wall of the back cover; coupling a front panel to a forward surface of the back cover with a first seal so that the front panel encloses the inner body within a cavity defined by the back cover and the front panel; coupling the front panel to a forward surface of the inner body with a second seal; and coupling the first face to a second face with an adhesive, the second face being coupled to a back wall of the inner body.

According to a variation of this method, the second face is disposed on a second component of the fastener assembly and the method further comprises removably attaching the second component of the fastener assembly to the back wall of the inner body so that the second face is disposed on a rearward side of the back wall of the inner body.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 8 is a cross-sectional view of a portion of a display device of a second form in accordance with the teachings of the present disclosure;

FIG. 9 is a cross-sectional view of a portion of a display device of a third form in accordance with the teachings of the present disclosure;

FIG. 10 is a cross-sectional view of a portion of a display device of a fourth form in accordance with the teachings of the present disclosure; and FIG. 11 is a cross-sectional view of a portion of a display device of a fifth form in accordance with the teachings of the present disclosure.

Figure 1:
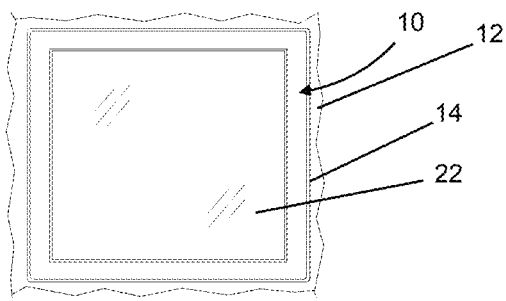
FIG. 1 is a front view of a display device according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 2:
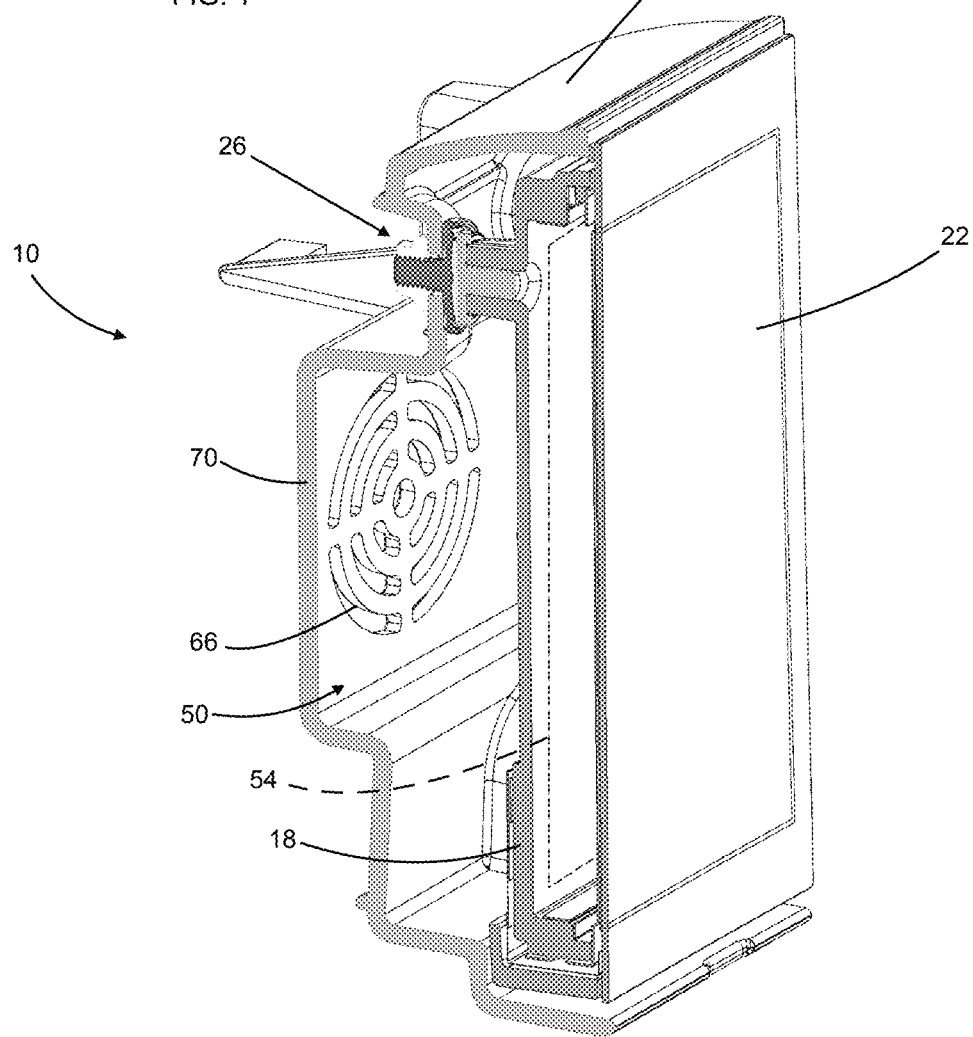
FIG. 2 is a cross-sectional perspective view of the display device of FIG. 1.

Referring to FIGS. 1 and 2, a device 10 includes a back cover 14, an inner body 18, a front panel 22, and at least one fastener assembly 26.

Figure 3:
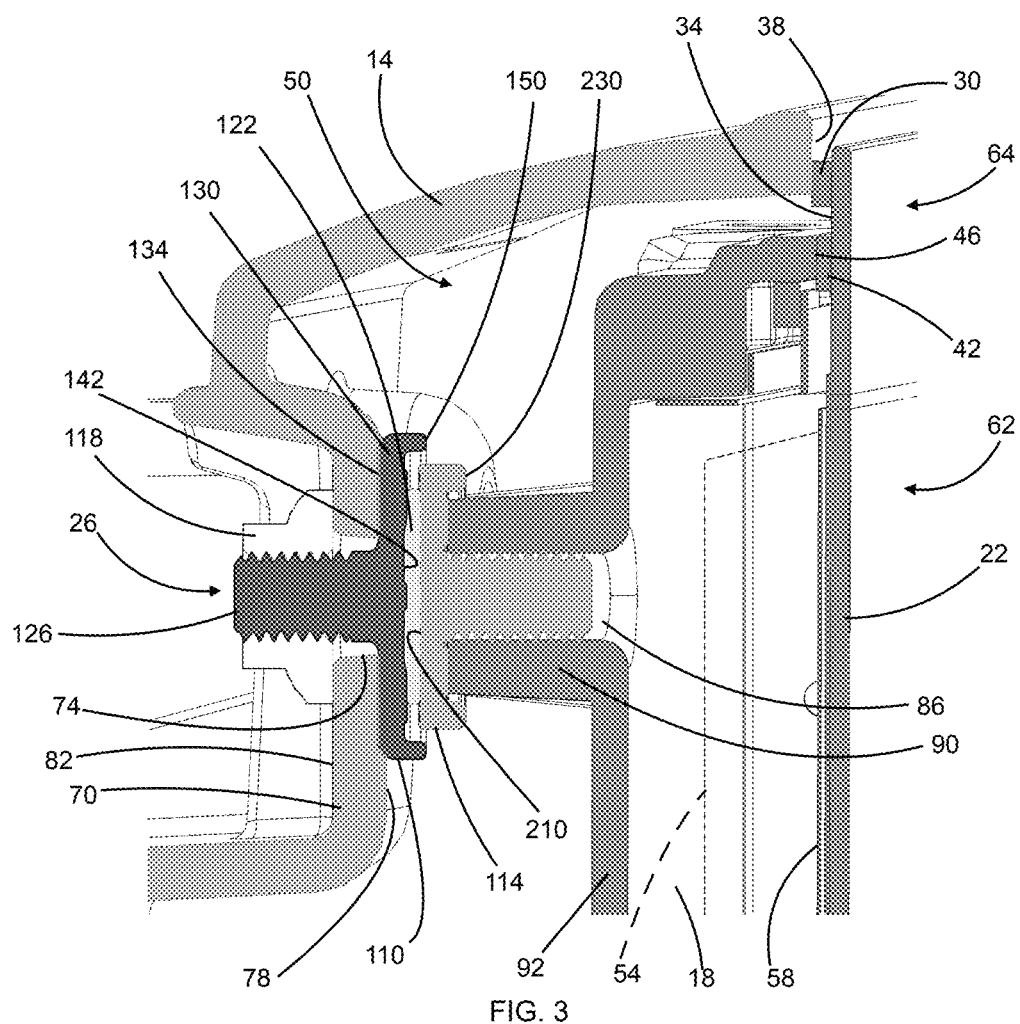
FIG. 3 is a cross-sectional view of a portion of the display device of FIG. 1, illustrating a fastener assembly of the display device in accordance with the teachings of the present disclosure.

Referring to FIG. 3, a first seal 30 sealingly couples a rear surface 34 of the front panel 22 to a front surface 38 of the back cover 14. The first seal 30 is a liquid-applied adhesive material, a resilient solid material (e.g., foam, rubber) with a thin, non-flowing adhesive on the surfaces contacting the rear surface 34 and the front surface 38, or a combination thereof. A second seal 42 sealingly couples the rear surface 34 of the front panel 22 to a front surface 46 of the inner body 18. The second seal 42 is a liquid-applied adhesive material, a resilient solid material (e.g., foam, rubber) with a thin, non-flowing adhesive on the surfaces contacting the rear surface 34 and the front surface 46, or a combination thereof.

One non-limiting example of a material for use as the first and/or second seals 30, 42 includes high-strength, double-sided acrylic foam tape (e.g., 3M™ VHB™ tape), polyurethane, or A/B polyurethane (e.g., Dupont™ 2810SV).

The back cover 14 and the inner body 18 are formed from generally rigid materials (e.g., plastic, composite, polymers, metal) and may be the same or different materials. The front panel is also formed from a generally rigid material, as described in greater detail below.

The front panel 22 and the back cover 14 cooperate to define a cavity 50. The inner body 18 is enclosed in the cavity 50 by the front panel 22 and the back cover 14. In one form, the front panel 22 is a generally flat panel and the front surfaces 38, 46 are similarly flat. In another form, the front panel 22 can have a curved shape that curves in one or more directions and the front surfaces 38, 46 are similarly curved. In other forms, not specifically shown, the front panel 22 may have a non-flat shape such as including protrusions, curvatures, and/or indentions. In another form, not specifically shown, the front panel 22 may have one or more apertures. The fastener assembly 26 removably couples the inner body 18 to the back cover 14.

The device may further include one or more interior components disposed within the cavity 50. In the example provided, the device 10 is a display device and includes electronics 54 (schematically shown in dashed lines) mounted to the inner body 18 and a display screen 58 (e.g., an LED or LCD screen) attached to the front panel 22 and connected for electrical communication with the electronics 54, though other types of interior components can be used. In the example provided, the front panel 22 has a region 62 that is transparent or translucent so that a user may view the display screen 58 from an exterior of the device 10. In the example provided, the front panel 22 has an opaque region 64 disposed about the transparent region 62, i.e., about the perimeter of the front panel 22 and overlapping the first and second seals 30, 42. In one form, the front panel 22 is a glass material, though other materials can be used such as transparent polymer materials for example. The front panel 22 may optionally be a touch screen.

Referring back to FIG. 2, the back cover 14 may optionally have one or more apertures (e.g., apertures 66) open through a wall 70 of the back cover 14 configured to provide power, data communication, and/or ventilation therethrough. In the example provided, the apertures 66 can provide ventilation into the cavity 50 for cooling. While not specifically shown, the electronics 54 may be connected to one or more ports (e.g., electrical connectors) accessible through one or more apertures in the back cover 14. While not specifically shown, one or more cables or wires may optionally extend through one or more apertures in the back cover 14. Such wires, cables, ports, connectors, etc. may provide electrical power to the electronics 54 and/or communication (e.g., electrical signals) between the electronics 54 and other devices (not shown) exterior to the device 10. The electronics 54 may optionally include a wireless communication module. In another form, not specifically shown, the back cover 14 may lack the apertures 66. In one such form, the cavity 50 may optionally be sealed fully sealed to inhibit ingress of liquids and/or debris.

Referring to FIG. 3, the wall 70 of the back cover 14 defines at least one fastening aperture 74 configured to receive a portion of the fastener assembly 26 therethrough, as described in detail below.

Referring back to FIG. 1, in the example provided, the device 10 is mounted to a component 12 of a vehicle. In one form, the component 12 is an instrument panel and the device 10 is a display commonly known as an infotainment display, though the component can be any suitable component in a vehicle or a non-vehicle structure (e.g., in a building, a portable device, a machine, a tool). In another form, the device 10 may be free-standing without the component 12.

In one alternative form, not specifically shown, the device 10 may lack the display screen 58 (FIG. 3) and the front panel 22 may optionally lack a transparent region (e.g., may be opaque and/or translucent without the transparent region 62). In such a form, the front panel 22 may be any suitable material (e.g., plastic, composite, polymer, metal, glass). In one such form, the device 10 may be a control module (e.g., ECU) of a vehicle and the electronics 54 (FIGS. 2 and 3) may be configured to control one or more systems of the vehicle exterior to the device 10.

Referring to FIG. 3, the fastener assembly 26 includes a first component 110, a second component 114, a retainer 118, and an adhesive 122. The retainer 118 removably couples the first component 110 to the back cover 14. The second component 114 is coupled to the inner body 18. The adhesive 122 couples the first component 110 to the second component 114.

Figure 4:
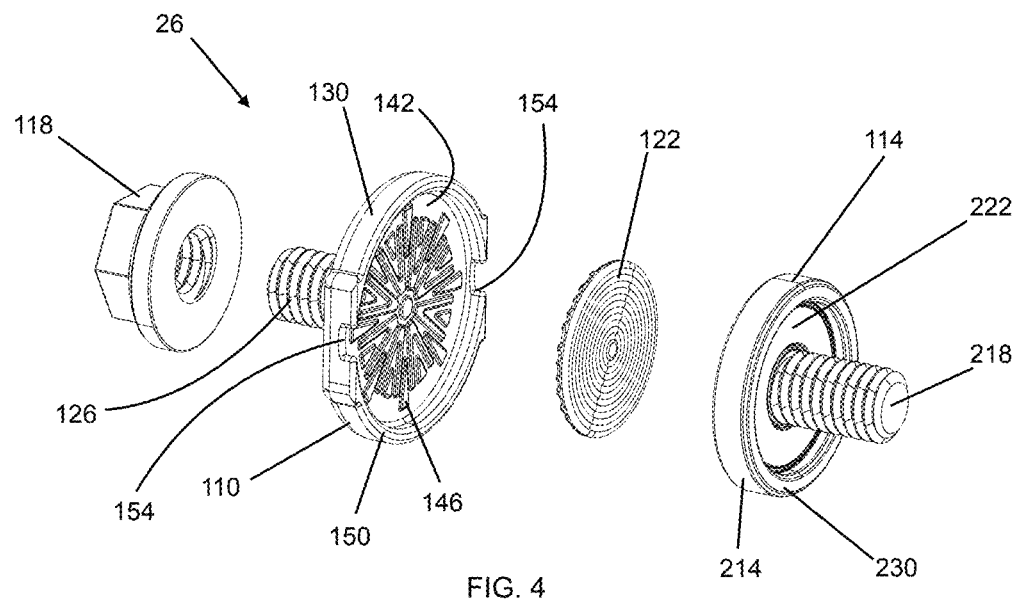
FIG. 4 is an exploded view of the fastener assembly of FIG. 3, shown from a first perspective.
Figure 5:
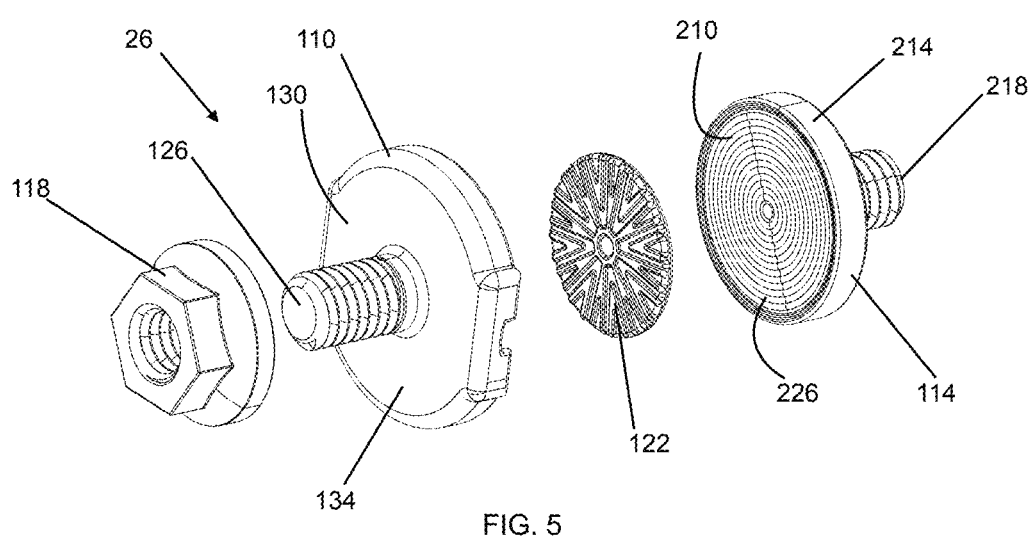
FIG. 5 is an exploded view of the fastener assembly of FIG. 3, shown from a second perspective.

Referring to FIGS. 4 and 5, the first component 110 includes a first stud 126 (also referred to herein as a first shaft), and a first head 130. The first stud 126 is coupled to and extends from a rear side 134 of the first head 130. In the example provided, the first stud 126 and the first head 130 are integrally formed such that the first component 110 is a single piece. In one form, the first component 110 is a plastic, polymer, or composite material. In another form, the first component 110 is a metal material. The first component 110 can be formed in any suitable manner such as casting, additive manufacturing (e.g., 3D printing), injection molding, milling.

In the example provided, the first stud 126 is a threaded stud with a thread form disposed about a central axis of the first stud 126, though other configurations can be used.

The first head 130 includes a first face 142 that generally faces in the axial direction away from the first stud 126.

The first face 142 may optionally include a plurality of protrusions 146 and/or recesses. The protrusions 146 and/or recesses can define a random pattern or a predetermined pattern. Each one of the protrusions 146 need not be identical and can include a variety of shapes. In one form, not specifically shown, the first face 142 may be substantially flat (i.e., substantially planar) without protrusions or recesses.

The first head 130 may optionally include an outer lip 150 that extends about at least a portion of the perimeter of the first face 142 and extends from the first face 142 axially in the axial direction away from the first stud 126. In the example provided, the outer lip 150 extends about the entire perimeter of the first face 142. The outer lip 150 may optionally define one or more openings 154 that are open radially outward through the outer lip 150. In the example provided the outer lip 150 defines two, diametrically opposed openings 154, though other configurations can be used. The outer lip 150 may extend in the axial direction away from the first stud 126 farther than the protrusions 146.

The retainer 118 is configured to removably attach to the first stud 126. In the example provided, the retainer 118 is a nut with a mating threadform configured to threadably couple the retainer 118 to the first stud 126, though other configurations can be used.

Referring to FIG. 3, the first head 130 is larger than the fastening aperture 74 and the first stud 126 is configured to extend through the fastening aperture 74 with the rear side 134 of the first head 130 abutting a forward side 78 of the wall 70. While not specifically shown, a washer may optionally be disposed between the rear side 134 and the forward side 78. The retainer 118 couples to the first stud 126 on the exterior of the wall 70 and can abut a rear side 82 of the wall 70. While not specifically shown, a washer and/or a biasing member (e.g., Belville spring washer, split ring lock washer) may optionally be disposed between the rear side 82 and the retainer 118.

The second component 114 includes a second face 210. The second face 210 faces generally toward the first face 142 when the first component 110 is mounted to the back cover 14 via the retainer 118. The second face 210 is configured to align with and oppose the first face 142 when the inner body 18 is properly positioned in the cavity 50.

Referring back to FIGS. 4 and 5, in the example provided, the second component 114 can include a second head 214 and a second stud 218 (also referred to herein as a second shaft). The second stud 218 is coupled to and extends from a forward side 222 of the second head 214. In the example provided, the second stud 218 and the second head 214 are integrally formed such that the second component 114 is a single piece. In one form, the second component 114 is a plastic, polymer, or composite material. In another form, the second component 114 is a metal material. The second component 114 can be formed in any suitable manner such as casting, additive manufacturing (e.g., 3D printing), injection molding, milling.

In the example provided, the second stud 218 is a threaded stud with a thread form disposed about a central axis of the second stud 218, though other configurations can be used.

Referring back to FIG. 3, in the example provided, the inner body 18 defines a bore 86 that has a threadform that mates with the threadform of the second stud 218. The bore 86 may optionally be formed in a boss 90 that extends rearward from a rear wall 92 of the inner body 18. In another form, not specifically shown, the bore 86 may not be threaded and a separate retainer (e.g., a nut) may attach to the stud on a forward side of the rear wall 92.

Referring to FIGS. 4 and 5, in the example provided, the second face 210 is a face of the second head 214 that generally faces in the axial direction away from the second stud 218.

The second face 210 may optionally include a plurality of protrusions 226 and/or recesses. The protrusions 226 and/or recesses can define a random pattern or a predetermined pattern. Each one of the protrusions 226 need not be identical and can include a variety of shapes. The protrusions 226 may or may not mirror or mate with the protrusions 146. In the example provided, the protrusions 146 are a plurality of geometric shapes (e.g., triangles and "V's") while the protrusions 226 are a plurality of concentric circular peaks separated by valleys, though other configurations can be used. In one form, not specifically shown, the second face 210 may be substantially flat (i.e., substantially planar) without protrusions or recesses.

The second head 214 may optionally include an outer lip 230 that extends about at least a portion of the perimeter of the second face 210 and extends from the second face 210 axially in the axial direction away toward the second stud 218 (i.e., in a forward direction of the device 10). In the example provided, the outer lip 230 extends about the entire perimeter of the second face 210. The outer lip 230 extends axially forward beyond the forward side 222 of the second head 214. In the example provided, the second stud 218 extends further in the forward axial direction from the forward side 222 than the outer lip 230, though other configurations can be used. The outer lip 230 defines an outermost perimeter of the second head 214 and has an outer diameter less than an inner diameter of the outer lip 150.

Referring back to FIG. 3, the adhesive 122 is configured to adhere the first face 142 to the second face 210. In the example provided, the adhesive 122 is a fluid-applied adhesive material. The adhesive 122 is configured to squeeze into the recesses or spaces between protrusions 146 (FIG. 4) of the first face 142 and the recesses or spaces between the protrusions 226 (FIG. 5) of the second face 210 such that the protrusions 146, 226 (FIGS. 4 and 5) increase the surface area to which the adhesive 122 acts.

In the example provided, when assembled in the device 10, the outer lip 230 may extend further forward than the outer lip 150. The outer lip 230 may optionally have an inner diameter greater than an outer diameter of the boss 90 such that it can extend axially over a portion of the boss 90. The outer lip 150 and outer lip 230 are configured to cooperate to help align the inner body 18 relative to the back cover 14 and to direct excess adhesive 122 to squeeze out in the forward direction between the outer lips 150, 230.

Figure 6:
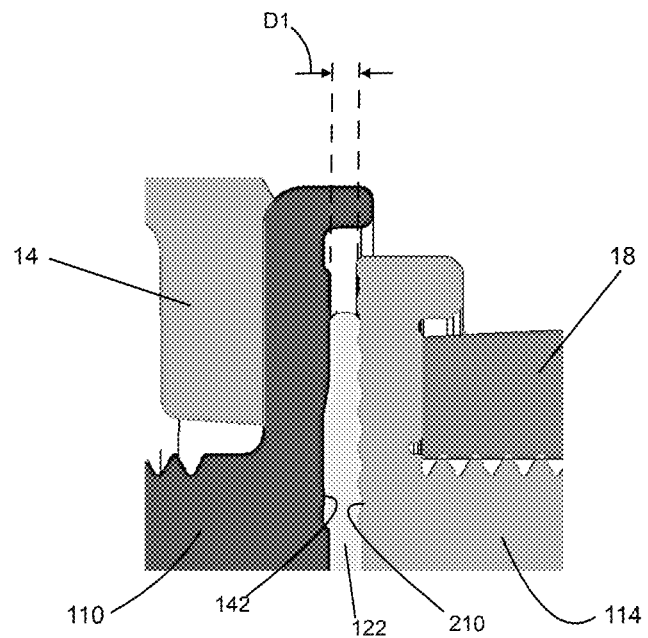
FIG. 6 is a cross-sectional view of a portion of the fastener assembly of FIG. 3.
Figure 7:
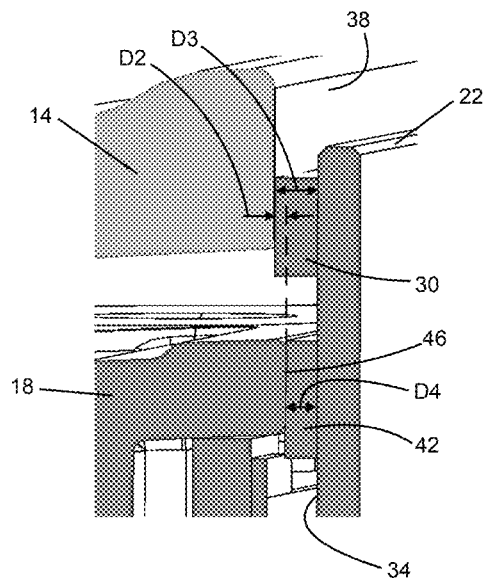
FIG. 7 is a cross-sectional view of a portion of the display device of FIG. 1, illustrating a sealing arrangement for a front panel of the display device in accordance with the teachings of the present disclosure.

Referring to FIGS. 6 and 7, the adhesive 122 is a type of adhesive configured to form a bond between the first face 142 and the second face 210 while the first and second faces 142, 210 are spaced apart by a predetermined distance D1, while permitting the first and second faces 142, 210 to be pressed further together while maintaining the bond at smaller distances than D1. The distance D1 is greater than a distance D2, with the distance D2 being the distance between front surfaces 38, 46. The distance D1 is also greater than a distance D3, with the distance D3 being the distance between front surface 38 and rear surface 34.

The distance D1 permits appropriate positioning of the front panel 22 even under large tolerance stackups for the components involved (e.g., the front panel 22, the first seal 30, the second seal 42, the back cover 14, the inner body 18, the first component 110, the second component 114). In other words, the connection provided by the adhesive 122 between the first and second faces 142, 210, can compensate for tolerance stackups between the components. This can reduce strain on the front panel 22 which, in the case where the front panel 22 is a glass panel, can reduce distortion and/or mura that can otherwise result from strain on the glass.

Some non-limiting examples of such adhesive materials that can be used for the adhesive 122 include polyurethane or A/B polyurethane (e.g., Dupont™ 2810SV). In one form, the adhesive 122 may be a fluid-applied adhesive that has a viscosity sufficient to remain in place while the first and second faces 142, 210 are vertically oriented and that can cure to the first and second faces 142, 210 in this position while the first and second faces 142, 210 are spaced apart by the distance D1.

The first seal 30 is configured to adhere to and form a seal between the front surface 38 and the rear surface 34 of the front panel 22 while the front surface 38 and the rear surface 34 are spaced apart by a distance D3. The second seal 42 is configured to adhere to and form a seal between the front surface 46 and the rear surface 34 of the front panel 22 while the front surface 46 and the rear surface 34 are spaced apart by a distance D4. Due to manufacturing tolerances, the distances D3 and D4 may be equal or may differ.

Referring to FIG. 8, a fastener assembly 26-1 of another form is illustrated. The fastener assembly 26-1 can be similar to the fastener assembly 26 (FIGS. 2-6) except as otherwise shown and described herein. Accordingly, similar features are shown with similar reference numerals followed by a "-1" and only differences are described in detail herein. In this form, the second component 114-1 can be integrally formed with the inner body 18. In the example provided, the second face 210-1 is disposed on the boss 90. In this form, the boss 90 may lack the bore 86 (FIG. 3). In another form, not specifically shown, the inner body 18 can lack the boss 90 and the second face 210-1 can be formed directly on the rear wall 92 of the inner body 18.

Referring to FIG. 9, a fastener assembly 26-2 of another form is illustrated. The fastener assembly 26-2 can be similar to the fastener assembly 26 (FIGS. 2-6) or the fastener assembly 26-1 (FIG. 8) except as otherwise shown and described herein. Accordingly, similar features are shown with similar reference numerals followed by a "-2" and only differences are described in detail herein. In this form, the first stud 126-2 is not threaded. Instead, the first stud 126-2 includes a groove 910 that extends circumferentially about the first stud 126-2 at a location along the first stud 126-2 that is exterior of the wall 70 when the first head 130-2 abuts the forward side 78 of the wall 70. The retainer 118-2 in this form is a snap ring (e.g., a C-ring) that is removably received in the groove 910 and extends radially outward therefrom. The retainer 118-2 may extend radially outward of the fastening aperture 74. A washer 914 may optionally be disposed between the rear side 82 and the retainer 118-2. The washer 914 may optionally also be configured to bias the retainer 118-2 axially away from the rear side 82 such as being a Belville spring washer for example.

Referring to FIG. 10, a fastener assembly 26-3 of another form is illustrated. The fastener assembly 26-3 can be similar to the fastener assembly 26 (FIGS. 2-6) or the fastener assembly 26-1 (FIG. 8) except as otherwise shown and described herein. Accordingly, similar features are shown with similar reference numerals followed by a "-3" and only differences are described in detail herein. In this form, the first stud 126-3 is not threaded. Instead, the first stud 126-3 includes a bore 1010 that extends radially through the first stud 126-3 at a location along the first stud 126-3 that is exterior of the wall 70 when the first head 130-3 abuts the forward side 78 of the wall 70. The retainer 118-3 in this form is a removable pin (e.g., a cotter pin) that is received in the bore 1010 and extends radially outward therefrom. The retainer 118-3 may extend radially outward of the fastening aperture 74. A washer 1014 may optionally be disposed between the rear side 82 and the retainer 118-3. The washer 1014 may optionally also be configured to bias the retainer 118-3 axially away from the rear side 82 such as being a Belville spring washer for example.

Referring to FIG. 11, a fastener assembly 26-4 of another form is illustrated. The fastener assembly 26-4 can be similar to the fastener assembly 26 (FIGS. 2-6) or the fastener assembly 26-1 (FIG. 8) except as otherwise shown and described herein. Accordingly, similar features are shown with similar reference numerals followed by a "-4" and only differences are described in detail herein. In this form, the first stud 126-4 is not threaded. Instead, the retainer 118-4 is integrally formed with the first stud 126-4. The first stud 126-4 includes a plurality of resilient prongs 1110 and the retainer includes corresponding lips 1114 that extend radially outward from each prong 1110. The prongs 1110 can be elastically deflected radially inward so that the lips 1114 can be received through the fastening aperture 74. Once released, the prongs 1110 return to their radially outward position (shown) such that the lips 1114 extend radially outward of the fastening aperture 74 at a location that is exterior of the wall 70 when the first head 130 abuts the forward side 78 of the wall 70. The prongs 1110 may optionally include ramped surfaces 1118 to facilitate insertion and deflection of the prongs 1110. While not specifically shown, a washer may optionally be disposed between the lips 1114 and the wall 70. The washer may optionally also be configured to bias the retainer 118-4 axially away from the rear side 82 such as being a Belville spring washer for example.

It is understood that the retainer configurations shown in FIGS. 9-11 can be used with the second component 114 of FIGS. 2-6 or the second component 114-1 of FIG. 8.

While only one fastener assembly 26 is shown coupling the inner body 18 to the back cover 14 in FIG. 2, additional instances of the fastener assembly 26 can be used to couple the inner body 18 to the back cover 14 in more than one location.

Referring back to FIG. 3, the device 10 can be assembled by securing the first component 110 to the back cover 14 and securing the second component 114 to the inner body 18 (if not integral therewith). The adhesive 122 is then applied to one or both of the first and second faces 142, 210. The inner body 18 can then be inserted into the cavity 50 so that the adhesive 122 is between the first and second faces 142, 210. The first and second seals 30, 42 can be applied to the back cover 14 and inner body 18 or the front panel 22 before or after inserting the inner body 18 into the cavity 50. The front panel 22 is then pressed rearward so that the first and second seals 30, 42 are pressed between the front panel 22 and the inner body 18 and the back cover 14 to form a seal therebetween. As the front panel 22 is pressed rearward, the adhesive 122 is compressed, taking up the tolerances in the distances between the front surfaces 38, 46 and the rear surface 34 (e.g., distance D2).

The fastener assembly 26 further permits the back cover 14 to be disassembled from the inner body 18 easily by removing the retainer 118 and the first seal 30 but without needing to remove the second seal 42. In the configuration where the second component 114 is removable from the inner body 18, the first and second components 110, 114 can then be easily replaced and the device 10 can be reassembled without ever removing the second seal 42.

In other words, one method of assembling the device 10 includes the step of positioning the first component 110 of the fastener assembly 26 so that the first stud 126 extends through the wall 70 of the back cover 14 and the first face 142 is disposed on a forward side of the wall 70. The method includes the step of removably attaching the retainer 118 to a portion of the first stud 126 that is disposed on a rearward side of the wall 70 to couple the first component 110 to the wall 70 of the back cover 14. The method includes the step of coupling the front panel 22 to the front surface 38 with the first seal 30 so that the front panel 22 encloses the inner body 18 within the cavity 50. The method further includes the step of coupling the front panel 22 to the front surface 46 with the second seal 42 and coupling the first face 142 to a second face 210 with the adhesive 122. The method may also include removably attaching the second component 114 to the rear wall 92 so that the second face 210 is disposed on a rearward side of the rear wall 92.

Thus, the teachings of the present disclosure provide the ability to open the device for service, if needed, where traditional devices and methods do not enable opening the device or make it very difficult to rework or repair and reassemble the device.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A device comprising:
an inner body;
a back cover;
a front panel sealingly coupled to a front surface of the back cover, the front panel enclosing the inner body within the back cover; and
a fastener assembly supporting the inner body relative to the back cover, the fastener assembly including:
a first component including a stud and a first face, the stud extending through a rear wall of the back cover, the first face being disposed on a forward side of the rear wall;
a second component coupled to a rear side of the inner body and including a second face opposing the first face;
a retainer removably engaging the stud on a rear side of the rear wall to couple the first component to the back cover; and
an adhesive adhering the first and second faces together.

2. The device according to claim 1, wherein the front panel is sealingly coupled to a front surface of the inner body.

3. The device according to claim 1, wherein the first and second faces are substantially planar.

4. The device according to claim 1, wherein at least one of the first face and the second face includes a plurality of recessed regions and protrusions.

5. The device according to claim 1, wherein the stud includes a thread and the retainer threadably engages the thread.

6. The device according to claim 1, wherein the second component includes a threaded shaft that is threadably engaged with a mating thread of the inner body.

7. The device according to claim 1, wherein the inner body includes a threaded shaft that is threadably engaged with a mating thread disposed on the second component.

8. The device according to claim 1, further comprising an electronic display mounted to a forward side of the inner body, wherein at least a region of the front panel is transparent or translucent, wherein the region is positioned so that the electronic display can be viewed therethrough from an exterior of the device.

9. The device according to claim 1, wherein the first component includes a lip, the first face being recessed rearward from the lip.

10. The device according to claim 9, wherein the lip extends about a perimeter of the first face and a perimeter of the second face.

11. The device according to claim 9, wherein the second component includes a lip that extends forward from a perimeter of the second face.

12. The device according to claim 1, wherein the second component includes a lip, the second face being recessed forward from the lip.

13. The device according to claim 12, wherein the lip extends about a perimeter of the first face and a perimeter of the second face.

14. A device comprising:
an inner body;
an electronic display mounted to a forward side of the inner body;
a back cover;
a front panel sealingly coupled to a front surface of the inner body and a front surface of the back cover, the front panel enclosing the inner body within a cavity defined by the back cover and the front panel, wherein at least a region of the front panel is transparent or translucent, wherein the region is positioned so that the electronic display can be viewed therethrough from an exterior of the device; and
a fastener assembly supporting the inner body relative to the back cover, the fastener assembly including:
a first component including a stud and a first face, the stud extending through a rear wall of the back cover, the first face being disposed on a forward side of the rear wall;
a second component coupled to a rear side of the inner body and including a second face opposing the first face;
a retainer removably engaging the stud on a rear side of the rear wall to couple the first component to the back cover; and
an adhesive adhering the first and second faces together.

15. The device according to claim 14, wherein the stud includes a thread and the retainer threadably engages the thread.

16. The device according to claim 14, wherein the first component includes a lip and the first face is recessed rearward from the lip, the lip extending at least partially about a perimeter of the first face.

17. The device according to claim 14, wherein at least one of the first face and the second face includes a plurality of recessed regions and protrusions.

18. The device according to claim 14, wherein one of the inner body and the second component includes a threaded shaft and the other one of the inner body and the second component includes a mating thread threadably engaged with the threaded shaft.

19. A method of assembling a device, the device including an inner body, a back cover, a front panel, and a fastener assembly, the method comprising:
positioning a first component of the fastener assembly so that a stud of the first component extends through a back wall of the back cover and a first face of the first component is disposed on a forward side of the back wall of the back cover;
removably attaching a retainer to a portion of the stud that is disposed on a rearward side of the back wall to couple the first component to the back wall of the back cover;
coupling a front panel to a forward surface of the back cover with a first seal so that the front panel encloses the inner body within a cavity defined by the back cover and the front panel;
coupling the front panel to a forward surface of the inner body with a second seal; and
coupling the first face to a second face with an adhesive, the second face being coupled to a back wall of the inner body.

20. The method according to claim 19, wherein the second face is disposed on a second component of the fastener assembly and the method further comprises removably attaching the second component of the fastener assembly to the back wall of the inner body so that the second face is disposed on a rearward side of the back wall of the inner body.

\* \* \* \* \*